(12) United States Patent
Teraki et al.

(10) Patent No.: US 9,795,056 B2
(45) Date of Patent: Oct. 17, 2017

(54) COOLING MEMBER WITH PRESSED PIPE

(71) Applicant: DAIKIN INDUSTRIES, LTD., Osaka-shi, Osaka (JP)

(72) Inventors: Junichi Teraki, Kusatsu (JP); Mitsuhiro Tanaka, Kusatsu (JP); Noriyuki Okuda, Kusatsu (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 14/593,419

(22) Filed: Jan. 9, 2015

(65) Prior Publication Data

US 2015/0116942 A1 Apr. 30, 2015

Related U.S. Application Data

(62) Division of application No. 13/127,158, filed as application No. PCT/JP2009/005831 on Nov. 2, 2009, now abandoned.

(30) Foreign Application Priority Data

| Nov. 4, 2008 | (JP) | 2008-283429 |
| Nov. 11, 2008 | (JP) | 2008-288566 |
| Nov. 11, 2008 | (JP) | 2008-288567 |
| Nov. 17, 2008 | (JP) | 2008-293253 |
| Nov. 2, 2009 | (JP) | 2009-251645 |

(51) Int. Cl.
*H05K 7/20* (2006.01)
*F28F 3/12* (2006.01)
*H01L 23/473* (2006.01)
*F28D 15/02* (2006.01)

(52) U.S. Cl.
CPC ...... *H05K 7/20254* (2013.01); *F28D 15/0275* (2013.01); *F28F 3/12* (2013.01); *H01L 23/473* (2013.01); *H05K 7/209* (2013.01); *H01L 2924/0002* (2013.01); *Y10T 29/49359* (2015.01); *Y10T 29/53113* (2015.01)

(58) Field of Classification Search
CPC .... F28F 3/12; F28D 15/0275; H05K 7/20254; H05K 7/209; Y10T 29/49359; Y10T 29/53113; H01L 23/473
USPC ........................................ 165/185
See application file for complete search history.

(56) References Cited

U.S. PATENT DOCUMENTS

| 4,031,745 A | 6/1977 | McCarty |
| 4,827,590 A | 5/1989 | Metzger |
| 5,349,131 A | 9/1994 | Sotani et al. |
| 5,826,645 A * | 10/1998 | Meyer, IV ............... F28D 15/02 165/104.33 |

(Continued)

FOREIGN PATENT DOCUMENTS

| JP | 58-106395 A | 6/1983 |
| JP | 61-6560 A | 1/1986 |

(Continued)

*Primary Examiner* — Travis Ruby
(74) *Attorney, Agent, or Firm* — Global IP Counselors, LLP

(57) ABSTRACT

A cooling member includes a heat-transfer member, a refrigerant introducing pipe and a covering material. The heat-transfer member has a surface with a groove opened to the surface of the heat-transfer member. The refrigerant introducing pipe is pressed into the groove. The covering material coats the surface of the heat-transfer member and the refrigerant introducing pipe.

4 Claims, 22 Drawing Sheets

(56) References Cited

U.S. PATENT DOCUMENTS

| | | | |
|---|---|---|---|
| 5,829,516 | A | 11/1998 | Lavochkin |
| 5,983,995 | A | 11/1999 | Shutou et al. |
| 6,037,736 | A | 3/2000 | Tsuruta et al. |
| 7,073,257 | B1 | 7/2006 | Hsu |
| 7,117,930 | B2 * | 10/2006 | Todd et al. ............... 165/104.21 |
| 2005/0263265 | A1 * | 12/2005 | Sheng et al. ............. 165/104.21 |
| 2007/0062677 | A1 * | 3/2007 | Usui et al. .................... 165/150 |
| 2007/0163770 | A1 * | 7/2007 | Liu et al. ....................... 165/185 |
| 2009/0266522 | A1 | 10/2009 | Lin et al. |

FOREIGN PATENT DOCUMENTS

| | | | |
|---|---|---|---|
| JP | 5-29783 | A | 2/1993 |
| JP | 7-303858 | A | 11/1995 |
| JP | 9-33170 | A | 2/1997 |
| JP | 9-176521 | A | 7/1997 |
| JP | 10-79586 | A | 3/1998 |
| JP | 10-132483 | A | 5/1998 |
| JP | 11-510962 | A | 9/1999 |
| JP | 2000-216313 | A | 8/2000 |
| JP | 2000-220973 | A | 8/2000 |
| JP | 2000-274974 | A | 10/2000 |
| JP | 2001-4101 | A | 1/2001 |
| JP | 2001-4228 | A | 1/2001 |
| JP | 2001-135966 | A | 5/2001 |
| JP | 2001-174188 | A | 6/2001 |
| JP | 2001-208496 | A | 8/2001 |
| JP | 2001-248982 | A | 9/2001 |
| JP | 2002-267376 | A | 9/2002 |
| JP | 2004-12817 | A | 1/2004 |
| JP | 2004-271068 | A | 9/2004 |
| JP | 2005-90794 | A | 4/2005 |
| JP | 2007-218439 | A | 8/2007 |

\* cited by examiner

Cross-section taken on A-A line

FIG. 6 (a)
FIG. 6 (b)
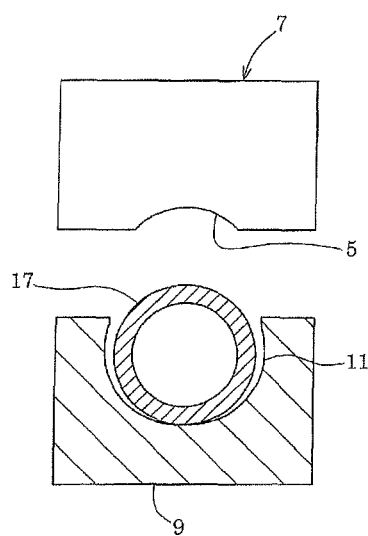
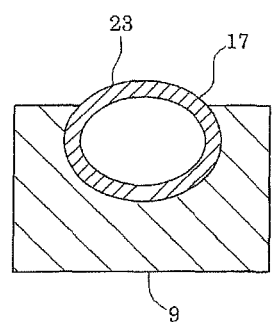

Cross-section taken on A'-A' line

PRIOR ART

PRIOR ART

COOLING MEMBER WITH PRESSED PIPE

CROSS-REFERENCE TO RELATED APPLICATIONS

This application is a divisional application of U.S. patent application Ser. No. 13/127,158 filed on May 2, 2011, which is a National Stage application of International Patent Application No. PCT/JP2009/005831 filed on Nov. 2, 2009. The entire disclosure of U.S. patent application Ser. No. 13/127,158 is hereby incorporated herein by reference.

TECHNICAL FIELD

The present invention relates to a cooling member formed by pressing a refrigerant introducing pipe into a groove of a heat-transfer member and a method and a device for manufacturing the same.

BACKGROUND ART

FIG. 19 shows a cooling member 607 formed by pressing a refrigerant introducing pipe 605 into a groove 603 of a heat-transfer member 601 and a punch 613 in which a pressing surface 611 is provided between two corners 609. The heat-transfer member 601 is an aluminum plate. The limit of a longitudinal direction in the groove 603 coincides with edges 615 of both sides of the heat-transfer member 601. The refrigerant introducing pipe 605 is a steel pipe. The cooling member 607 is assembled by the procedures mentioned below.

As shown in FIG. 20(a), the corners 609 of the punch 613 are positioned right above the edges 615 of the heat-transfer member 601 and the refrigerant introducing pipe 605 is inserted into the groove 603. At this point, as shown in 20(b), there is a clearance between an inner surface of the groove 603 and the refrigerant introducing pipe 605. Subsequently, the punch 613 is moved forward (fall) toward the groove 603 to press the pressing surface 611 of the punch 613 to the refrigerant introducing pipe 605. Thereby, as shown in FIGS. 20(c) and 20(d), the refrigerant introducing pipe 605 is plastically deformed and a joint between the heat-transfer member 601 and the refrigerant introducing pipe 605 at a place where the refrigerant introducing pipe 605 is closely fitted with the inner surface of the groove 603 is completed.

However, when the refrigerant introducing pipe 605 is pressed by the punch 13, scars 617 caused by the corners 609 remain on a surface of the refrigerant introducing pipe 605, resulting in damage in reliability of the refrigerant introducing pipe 605. When an external force is applied to the refrigerant introducing pipe 605 in a bending direction after the heat-transfer member 604 and the refrigerant introducing pipe 605 are joined, its stress focuses near a boundary between the refrigerant introducing pipe 605 and the edges 615, resulting in reduction in physical strength of the refrigerant introducing pipe 605. Although it is possible to avoid the focus of the aforementioned stress by performing R processing at the rim of the groove 603 so that clearance between the inner surface of the groove 603 and the refrigerant introducing pipe 605 may be formed near the edges 615, an extra processing expense for the processing is needed.

A reaction force created when the refrigerant introducing pipe 605 is pressed by the punch 613 allows the refrigerant introducing pipe 605 to bend toward the opposite side of the corners 609. This causes errors in dimension and direction of the refrigerant introducing pipe 605 projected from the edges 615 of the heat-transfer member 601. θ in FIG. 20(c) indicates an angle at which the refrigerant introducing pipe 605 is bent by the aforementioned reaction force.

Further, in the case where the refrigerant introducing pipe 605 is protected with a coating material after the assembling of the cooling member 607, the coating material is applied on a surface 619 of the heat-transfer member 601 and the refrigerant introducing pipe 605 and the coating material is further applied to the boundary between the refrigerant introducing pipe 605 projected from the edges 615 and the edges 615. The latter work is so troublesome that care should be taken to continue applying the coating material in the whole circumference of the refrigerant introducing pipe 605. In addition to that, technologies to fit metal pipes or the like into grooves are disclosed in JP 2007-218439 A, JP 2005-90794 A, and JP 10-79586 A.

In order to cool electric parts for producing heat such as power modules, it is designed that a refrigerant introducing pipe made of copper to which a refrigerant is introduced is inserted into a groove formed in an aluminum cooling member to make the cooling member in contact with the aforementioned electric parts. In this case, the refrigerant introducing pipe inserted into the groove of the cooling member is plastically deformed so as to be closely fitted with the groove of the cooling member with a press machine or the like, so that the refrigerant introducing pipe and the cooling member are joined.

However, when the refrigerant introducing pipe and the cooling member build up condensation at the time of cooling at lower temperatures than the atmosphere, corrosion of the refrigerant introducing pipe and the cooling member caused by moisture which gets into a joint (boundary) between the refrigerant introducing pipe and the cooling member becomes a problem. The aforementioned problem becomes prominent when poisonous gas which deteriorates metals is contained in the atmosphere or when poisonous gas or salt is dissolved in a dew condensation water under an environment of the splash of salt.

Further, in accordance with the progress of corrosion of the refrigerant introducing pipe and the cooling member, thermal resistance of the joint is increased, which leads to prevent the electric parts from being cooled. This deteriorates performance of the electric parts. Technologies related to a joint between a refrigerant introducing pipe and a cooling member are disclosed in JP 58-106395 A.

Moreover, technologies for bonding a pipe or the like to a groove of a heat-transfer member are disclosed in JP 2007-218439 A, JP 2005-90794 A, and JP 10-79586 A. As shown in FIG. 21(a), when manufacturing a cooling member formed by pressing a refrigerant introducing pipe into a groove of a heat-transfer member, a refrigerant introducing pipe 709 enters a groove 707 where an opening 705 is opened on a surface 703 of a heat-transfer member 701. Subsequently, the refrigerant introducing pipe 709 is pressed into the groove 707 with a punch 711 to plastically deform the refrigerant introducing pipe 709 so as to be closely fitted with an inner circumferential surface 713 of the groove 707 as shown in FIG. 21(b). This makes it possible to enlarge the width of the refrigerant introducing pipe 709 greater than a width A of the opening 705 to join the heat-transfer member 701 to the refrigerant introducing pipe 709.

The inner circumferential surface 713 of the opening 705 is in such a shape that the cross section in a width direction thereof is substantially arc-shaped. For instance, an external force in a deviation direction may be applied to the refrigerant introducing pipe 709. When the magnitude of this external force exceeds a friction force between the heat-transfer member 701 and the inner circumferential surface 713, such defects that the refrigerant introducing pipe 709 rotates relative to the heat-transfer member 701 occur. There is a limit to increase the aforementioned frictional force by simply increasing a force to press the refrigerant introducing pipe 709 with the punch 711.

It is preferable to increase an over hang quantity obtained by deducing the difference between the width A of the opening 705 and a full width B of the inner circumferential surface 713 to strengthen the join between the heat-transfer member 701 and the refrigerant introducing pipe 709 an that the refrigerant introducing pipe 709 plastically deformed as mentioned above may not be peeled off from the groove 707 of the heat-transfer member 701. However, to insert the refrigerant introducing pipe 709 into the groove 707 after passing through the opening 705, the width A of the opening 705 is needed to be greater than the diameter $\phi$ of the refrigerant introducing pipe 709. Accordingly, it is difficult to widen the difference between the width A and the full width B and the over hang quantity is limited. This causes a problem that it is impossible to strengthen the join between the heat-transfer member 701 and the refrigerant introducing pipe 709.

As shown in FIG. 22(a), a refrigerant introducing pipe 809 with diameter $\phi$ is inserted into a groove 807 where an opening 805 is opened on a surface 803 of a heat-transfer member 801 to press the refrigerant introducing pipe 809 into the groove 807 with a punch 811. This deforms the refrigerant introducing pipe 809 plastically so that the refrigerant introducing pipe 809 may be closely fitted with an inner circumferential surface of the groove 807 as shown in FIG. 22(b).

Since an outer circumference ($\pi$ $\phi$) of the refrigerant introducing pipe 809 and the circumference L of the groove 807 respectively include dimension errors, as shown in FIG. 22(c), there is a possibility that the refrigerant introducing pipe 809 is not closely fitted with the inner circumferential surface of the groove 807. AS a result, a clearance may remain between the refrigerant introducing pipe 809 and the groove 807. In this case, heat transfer from the heat-transfer member 801 to the refrigerant introducing pipe 809 is interfered. Further, when an external force is applied to the refrigerant introducing pipe 809 in a twisted direction, the refrigerant introducing pipe 809 has a problem with rotation relative to the heat-transfer member 801. Alternatively, as shown in FIG. 22(d), the refrigerant introducing pipe 809 forcibly pressed into the groove 807 may be bent in a concave shape. In this case, the cross-section area of the inner refrigerant introducing pipe 809 is becoming smaller, which results in interference of a flow of a refrigerant to be introduced to the refrigerant introducing pipe 809.

However, it is difficult to manage dimensions of the heat-transfer member 801 and the refrigerant introducing pipe 809 in an integrated fashion because the two respectively have a different manufacturing process, thereby it is inevitable to make the quality of the cooling member unstable.

SUMMARY

It is an object of the present invention to provide a cooling member to prevent a corner of a punch from being excessively pressed to a surface of a refrigerant introducing pipe and free from deterioration in reliability and physical strength and a method and a device for manufacturing thereof. Moreover, It is another object of the present invention to provide a cooling member which is capable of finishing dimensions of the refrigerant introducing pipe that projects from the heat-transfer member and the direction thereof with high precision, a method and a device for manufacturing thereof.

It is still another object of the present invention to provide a cooling member which is capable of avoiding corrosion of a refrigerant introducing pipe and a heat-transfer member and maintaining heat transfer between the refrigerant introducing pipe and the heat-transfer member in good condition.

It is a further object of the present invention to provide a cooling member in which a heat-transfer member and a refrigerant introducing pipe are firmly joined and a method for manufacturing thereof.

It is a still further object of the present invention to provide a cooling member which is capable of performing good heat transfer from a heat-transfer member to a refrigerant introducing pipe and securing a good flow of a refrigerant to be introduced into the refrigerant introducing pipe, and a method for manufacturing thereof. It is another object of the present invention to provide a cooling member which is capable of firmly holding the refrigerant introducing pipe on the heat-transfer member relative to an external force in a twisted direction applied to the refrigerant introducing tube, and a method for manufacturing thereof.

In a first preferred aspect of the present invention, to attain the aforementioned objects, a method for manufacturing a cooling member according to the present invention configured to form a groove in a heat-transfer member having at least one edge which is a longitudinal limit of the groove and press a refrigerant introducing pipe into the groove, which comprises the steps of: preparing a punch having at leas one corner formed in a curved surface shape at one end or more and a pressing surface adjacent to the corner to arrange the pressing surface of the punch at a position opposite to the groove; positioning the corner of the punch inwardly of the edge longitudinally located in the heat-transfer member; and moving the punch closer to the groove to press the refrigerant introducing pipe into the groove with the pressing surface.

In a second preferred aspect of a cooling member according to the present invention configured to form a groove in a heat-transfer member having at least one edge which is a longitudinal limit of the groove and press a refrigerant introducing pipe into the groove with a press machine, a region to be pressed, which shrinks by being pressed with the press machine is provided in the refrigerant introducing pipe, is positioned inwardly of the edge longitudinally located in the heat-transfer member and at least one curbed surface portion in the shape of gradually shrinking in a direction where the refrigerant introducing pipe is pressed to the press machine with a move from the edge of the heat-transfer member to the region to be pressed.

In a third preferred aspect, a device for manufacturing a cooling member according to the present invention configured to form a groove in a heat-transfer member having at least one edge which is a longitudinal limit of the groove and press a refrigerant introducing pipe into the groove, the device comprises: a punch having at least one corner formed in a curbed surface shape at one end or more and a pressing surface adjacent to the corner; and a support for supporting the heat-transfer member in such a posture that the groove is arranged at a position opposite to the pressing surface, wherein the corner contacts the refrigerant introducing pipe inwardly of the edge longitudinally located in a process in which the punch presses the refrigerant introducing pipe into the groove with the pressing surface.

In a fourth aspect of a device for manufacturing a cooling member according to the present invention, at least one back-up portion extending outwardly of the edge longitudinally located in the heat-transfer member is provided on the punch and the back-up portion hits against the refrigerant introducing pipe when the corner of the punch comes into contact with the refrigerant introducing pipe.

In a fifth preferred aspect of a cooling member according to the present invention, the heat-transfer member has a surface where the groove is opened and the surface of the heat-transfer member and the refrigerant introducing pipe are coated with a covering material.

In a sixth preferred aspect of a cooling member according to the present invention, the covering material is a coating material to be applied to the heat-transfer member and the refrigerant introducing pipe.

In a seventh preferred aspect of a cooling member according to the present invention, the covering material is a cover for covering the heat-transfer member.

In an eighth preferred embodiment of a cooling member according to the present invention, electric parts are mounted on one surface and a heat-conducting member for making the heat-transfer member and the refrigerant introducing pipe closely fitted with each other is provided on the other surface.

In a ninth preferred aspect of a cooling member according to the present invention, a sealing member for intervening between the groove of the heat-transfer member and the refrigerant introducing pipe is provided outwardly of the end longitudinally located in the region to be pressed.

In a tenth preferred aspect of a cooling member according to the present invention, the groove has an inner circumferential surface in an oval shape to determine a center inwardly of the opening opened to a surface of the heat-transfer member and conform a direction of a major axis to a width direction of the opening and the refrigerant introducing pipe comprises: a curved portion being closely fitted with the inner circumferential surface; and a plane portion for blocking the opening. And in the cooling member according to the present invention, the oval is an ellipse.

In an eleventh preferred aspect, a method for manufacturing a cooling member according to the present invention comprises the steps of: preparing a punch having least one corner formed in a curved surface shape at one end or more and a pressing surface adjacent to the corner; preparing a heat-transfer member having a groove which has an inner circumferential surface in an oval shape to determine a center inwardly of the opening and conform a direction of a major axis to a width direction of the opening; inserting a refrigerant introducing pipe into the groove to arrange a pressing surface of the punch at a position opposite to the groove; positioning the corner of the punch inwardly of at least one edge longitudinally located in the heat-transfer member; moving the punch closer to the groove to press the refrigerant introducing pipe into the groove with the pressing surface; and plastically deforming the refrigerant introducing pipe so as to be closely fitted with the inner circumferential surface of the groove. And in the cooling member according to the present invention, the oval is an ellipse.

In a twelfth preferred aspect of the cooling member according to the present invention, a center of curvature of the inner circumferential surface in the groove is determined inwardly of the opening and a length obtained by adding the circumference of the inner circumferential surface to the width of the opening is shorter than an outer circumference of the refrigerant introducing pipe and the refrigerant introducing pipe comprises: a curbed portion being closely fitted with the inner circumferential surface; and a plane portion for blocking the opening and projecting from the surface.

In a thirteenth preferred aspect of a method for manufacturing a cooling member according to the present invention, the method comprises the steps of: preparing a punch having at least one corner formed in a curved surface shape at one end or more and a pressing surface adjacent to the corner; preparing a heat-transfer member having a groove wherein a center of curvature of an inner circumferential surface is determined inwardly of an opening and a length obtained by adding the circumference of the inner circumferential surface to the width of the opening is shorter than an outer circumference of the refrigerant introducing pipe; inserting a refrigerant introducing pipe into the groove to arrange a pressing surface of the punch at a position opposite to the groove; positioning the corner of the punch inwardly of at least one edge longitudinally located in the heat-transfer member; moving the punch closer to the groove with the pressing surface; and plastically deforming the refrigerant introducing pipe so as to be closely fitted with the inner circumferential surface of the groove.

According to a method for manufacturing a cooling member of the present invention, although the entire area of a pressing surface of a punch comes in contact with a refrigerant introducing pipe substantially at the same time in a process for moving the punch closer to a groove of a heat-transfer member, at least one corner of the punch gradually comes in contact with a surface of the refrigerant introducing pipe as the refrigerant introducing pipe is pressed to a pressing surface to be plastically deformed because the corner is formed in a curved surface shape at one end or more of the punch. Since this makes it possible to disperse a force in which the corner of the punch presses the refrigerant introducing pipe, it is possible to keep the surface of the refrigerant introducing pipe smooth and secure reliability and physical strength of the refrigerant introducing pipe.

In addition, a reaction force for plastically deforming the refrigerant introducing pipe is completely received by the heat-transfer member because the punch is such positioned that the corner of the punch can be positioned inwardly of at least one edge longitudinally located in the heat-transfer member. Therefore, according to the method for manufacturing a cooling member of the present invention, an unnecessary bending force is not applied to the refrigerant introducing pipe projecting from the edge of the heat-transfer member, which leads to assemble a cooling member that is accurate in dimension and direction of the refrigerant introducing pipe projected from the edge of the heat-transfer member.

In a device for manufacturing a cooling member of the present invention, back-up portions hit against the refrigerant introducing pipe in a process wherein the punch presses the refrigerant introducing pipe into the groove with a pressing surface of the punch because the back-up portions extend from both ends of the punch. This makes it possible to restrict the refrigerant introducing pipe to upwardly warp by a reaction force of the plastic deformation caused by a press machine of the refrigerant introducing pipe and assemble the cooling member that is accurate in dimension and direction of the refrigerant introducing pipe projecting from the edge of the heat-transfer member.

In the cooling member of the present invention, a region to be pressed is formed in the refrigerant introducing pipe by the shrinkage of the refrigerant introducing pipe in a direction of being pressed by a press machine. This region to be pressed is positioned inwardly of at least one edge longitudinally located in the heat-transfer member. Further, a curbed surface portion in the shape of gradually shrinking in a direction being pressed by the press machine with a move from the edge of the heat-transfer member to the region to be pressed. Accordingly, even when an external force is applied to the refrigerant introducing pipe in a bending direction, it is possible to disperse stress relative to the external force to curved surface portions. This makes it possible to secure physical strength of the refrigerant introducing pipe.

Moreover, in the cooling member assembled by a method for manufacturing the cooling member of the present invention, a clearance between an inner surface of the groove in the heat-transfer member and the refrigerant introducing pipe remains near the edge of the heat-transfer member. Accordingly, even when an external force is applied to the refrigerant introducing pipe in the bending direction, it is possible to avoid the concentration of stress relative to the external force near a boundary between the refrigerant introducing pipe and the edge of the heat-transfer member. As a result, it is possible to reduce time and an expense for carrying out R processing on each heat-transfer member which was conventionally needed.

For instance, it is possible to easily perform coating work of applying a coating material to the refrigerant introducing pipe by introducing the coating material into the whole circumference of the refrigerant introducing pipe utilizing a capillarity phenomenon in which the coating material is drawn into the aforementioned clearance. Further, this work can be done from a surface side of the cooling member and thus it is possible to efficiently apply the coating material to a desired location of the cooling member. It is also possible to perform the aforementioned method by the device for manufacturing the cooling member of the present invention.

In the cooling member of the present invention, the heat-transfer member and the refrigerant introducing pipe inserted into a groove of the heat-transfer member are coated with a covering material to block the surrounding atmosphere from a joint between the heat-transfer member and the refrigerant introducing pipe. Accordingly, even when the heat-transfer member and the refrigerant introducing pipe build up condensation, it is possible to prevent moisture from entering the joint. It is also possible to prevent the heat-transfer member and the refrigerant introducing pipe from corrosion even when the heat-transfer member and the refrigerant introducing pipe contact poisonous gas or are in an environment in which salt is splashed. In addition, the cooling member is capable of securing preferable heat transfer between the heat-transfer member and the refrigerant introducing pipe and promoting cooling of electric parts. As a result, it is possible to enable the electric parts to exert its performance properly.

In the case where the covering material of the cooling member of the present invention is a coating material, the application of the coating material to the heat-transfer member and the refrigerant introducing pipe alone makes it possible to easily attain the aforementioned advantage. Alternatively, in the case where the covering material is a cover for covering the heat-transfer member, there is an advantage that there is a low possibility of the covering material being damaged by an external force or an impact because physical strength of the covering material is higher than the aforementioned coating material.

For instance, the electric parts and the heat-transfer member may be connected to each other through a heat-conducting member. In this case, it is possible to utilize the heat-conducting member as a covering material when the electric parts are mounted on one surface of the heat-conducting member and the heat-transfer member is closely fitted with the refrigerant introducing pipe on the other surface of the heat-conducting member. This eliminates the use of the aforementioned coating material or the aforementioned cover, so that the number of corrosion preventive structured parts is reduced, resulting in reduction in manufacturing costs.

In the case where a sealing member is inserted into the aforementioned clearance remained between an inner surface of the groove of the heat-transfer member and the refrigerant introducing pipe, it is possible to prevent from the entering of water or dust and the like between the heat-transfer member and the refrigerant introducing pipe.

According to a method for manufacturing the cooling member of the present invention, it is possible to plastically deform the refrigerant introducing pipe so as to be closely fitted with an inner circumferential surface of the groove by inserting the refrigerant introducing pipe into the groove of the heat-transfer member and pressing the refrigerant introducing pipe into the groove by the punch. Further, the inner circumferential surface of the groove is in an oval shape in which a center is determined inwardly of the opening. Accordingly, it is possible for the cooling member manufactured by the method mentioned herein to prevent the refrigerant introducing pipe from rotating relative to the heat-transfer member free from heavy dependence on a frictional force between the heat-transfer member and the inner circumferential surface, even when an external force in a deviation direction is applied to the refrigerant introducing pipe that is closely fitted with the inner circumferential surface of the groove.

Additionally, in the cooling member of the present invention, the dimension difference between a major axis of the oval and the width of the groove becomes larger than the case where the cross section of the inner circumferential surface is in a conventional arc shape because the direction of the major axis in the aforementioned oval coincides with the width direction of the groove. In the process of forming a groove in the cooling member, that is advantageous to increase an over hang quantity and thus it is possible to strengthen the join between the heat-transfer member and the refrigerant introducing pipe. Particularly, in the case where the aforementioned oval is an ellipse, there is an advantage that it is possible to quantitatively determine the over hang quantity in the procedures that will be described later.

Moreover, the cooling member of the present invention is manufactured in the method as below. That is, the refrigerant introducing pipe is inserted into the groove of the heat-transfer member to press the refrigerant introducing pipe into the groove with a punch. The refrigerant introducing pipe partially projects from the opening of the groove at the point when the refrigerant introducing pipe to be plastically deformed is closely fitted with the inner circumferential surface of the groove. Simultaneously, the full width of the refrigerant introducing pipe becomes greater than the opening, resulting in the completion of the joint between the heat-transfer member and the refrigerant introducing pipe.

Thus, according to the manufacturing method for the cooling member of the present invention, there is no possibility of a clearance remaining between the heat-transfer member and the refrigerant introducing pipe at the point when the heat-transfer member is joined to the refrigerant introducing pipe, even when an dimensional error is respectively included in the outer circumference of the refrigerant introducing pipe and the circumference of the inner circumferential surface in the groove. This makes the cooling member manufactured by the manufacturing method of the present invention possible to materialize preferable heat-transfer from the heat-transfer member to the curved portion of the refrigerant introducing pipe.

In the cooling member of the present invention, it is possible to prevent the refrigerant introducing pipe from being bent by force by setting a force to press the refrigerant introducing pipe with the punch until the refrigerant introducing pipe partially projects from the groove, which leads to form a plane portion in the refrigerant introducing pipe. Since this makes it possible to restrict a decrease in the cross sectional area of the refrigerant introducing pipe caused by plastic deformation, the cooling member manufactured by the manufacturing method for the cooling member is capable of securing a preferable flow of a refrigerant to be introduced into the refrigerant introducing pipe.

BRIEF DESCRIPTION OF THE DRAWINGS

FIG. 6(a) is a cross-sectional view in a width direction showing a process of a third variant of the manufacturing device for the cooling member according to Example 1 of the present invention;

FIG. 6(b) is a cross-sectional view of a cooling member manufactured by the device;

DETAILED DESCRIPTION OF EMBODIMENT(S)

The cooling member, the device and the method for manufacturing the cooling member according to the present invention will now be described in the following Examples 1 to 3.

EXAMPLE 1

Figure 1:
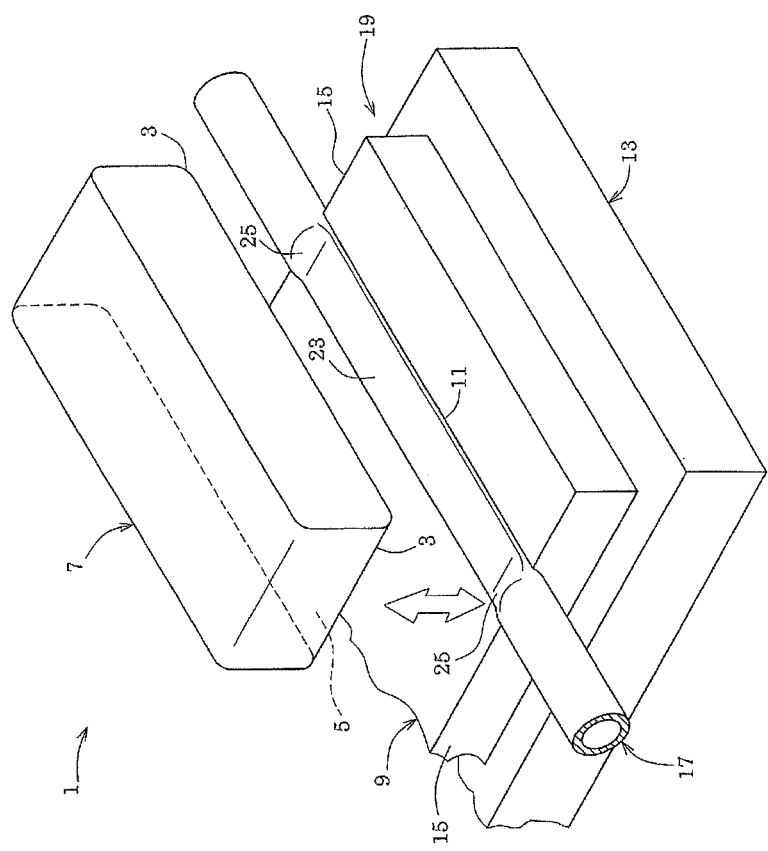
FIG. 1 is a perspective view showing a cooling member and a main portion of a manufacturing device thereof according to Example 1 of the present invention.

As shown in FIG. 1, a device 1 for manufacturing a cooling member comprises: a punch 7 wherein corners 3 are formed in a curved surface shape at both ends and a pressing surface 5 is a lower surface of the web of the punch 7; and a support 13 for supporting a heat-transfer member 9 in such a posture that a groove 11 is arranged at a position opposite to the pressing surface 5.

The punch 7 is a cuboid in which two corners 3 are respectively located adjacent to the pressing surface 5. The wording "in a curbed surface state" of the corners 3 herein does not only mean that the surface is a spherical-like state but also means an aspheric surface-like state. Further, the punch 7 is to be attached to a ram of a press machine as a mold. Since a press machine is an obvious art, it is omitted in figures. The support 13 is a jig for positioning the heat-transfer 9 on a bed of the press machine and may fix the heat-transfer member 9 using bolts or the like.

Figure 2:
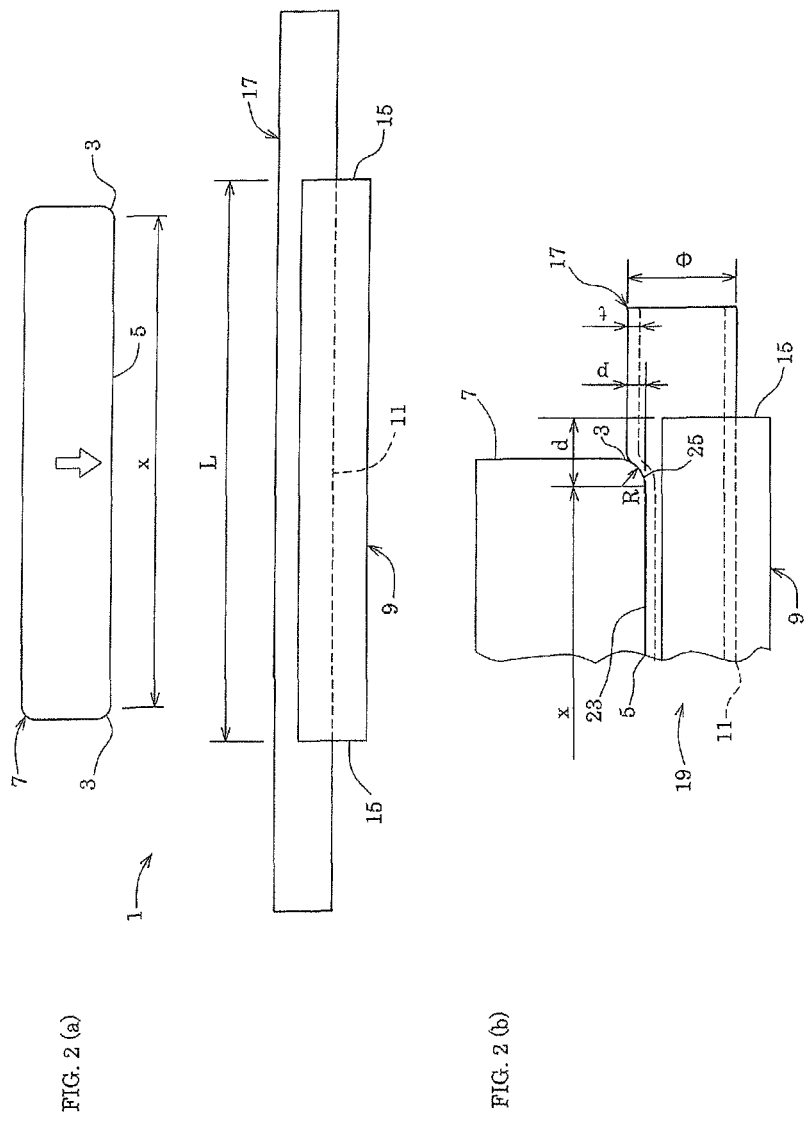
FIG. 2(a) is a side view illustrating dimensions of a punch and a heat-transfer member applied to the manufacturing device for a cooling member according to Example 1 of the present invention.
FIG. 2(b) is a side view illustrating dimensions of a refrigerant introducing pipe deformed by the punch.

FIG. 2(a) shows a state that the punch 7 moves backward (rise) from the heat-transfer member 9. And FIG. 2(b) shows a state that the punch 7 moves closer to the heat-transfer member 9. As mentioned above, the two corners 3 of the punch 7 arranged at a position opposite to the heat-transfer member 9 are respectively positioned inwardly of edges 15 longitudinally located at both sides of the heat-transfer member 9. Dimension d shows a distance from a boundary between the corners 3 and the pressing surface 5 to the edges 15. A width x to be pressed which corresponds to longitudinal dimensions of the pressing surface 5 is set to be shorter than a full width L. The full width L is a distance where the edges 15 of both sides of the heat-transfer member 9 are spaced.

Figure 3:
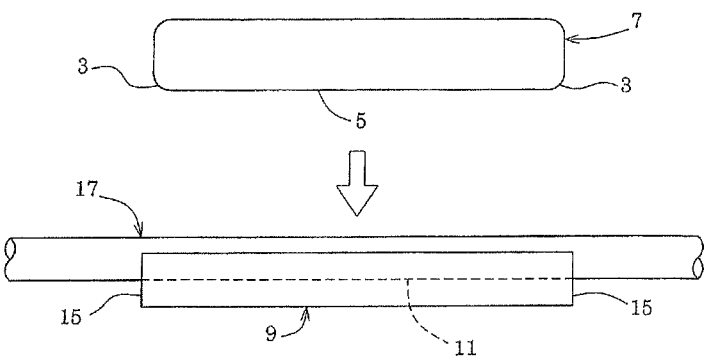
FIGS. 3(a) to 3(c) are respectively a side view illustrating procedures of a manufacturing method to be carried out using the manufacturing device or the cooling member of the present invention.
FIG. 3(d) is a cross-sectional view in a width direction in which the cooling member is fractured on A-A lines.
Figure 3:
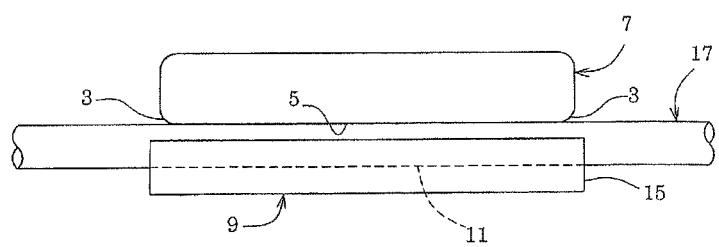
Figure 3:
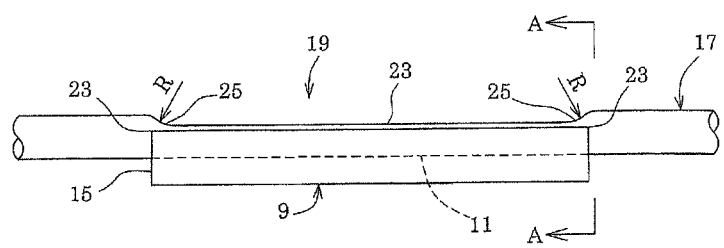
Figure 3:
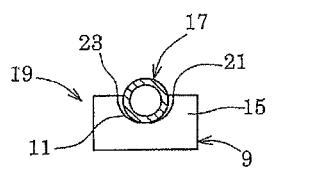

Referring to a method for manufacturing a cooling member as below. As shown in FIG. 3(a), the punch 7 is moved backward from the heat-transfer member 9 to insert a refrigerant introducing pipe 17 into a groove 11 and then the punch 7 is moved forward. In this process, as shown in FIG. 3(b), first, the entire area of the pressing surface 5 of the punch 7 contacts the refrigerant introducing pipe 17. The refrigerant introducing pipe 17 is pressed to the pressing surface 5 by further moving the punch 7 forward to be plastically deformed into a flattened shape, the corners 3 gradually come in contact with a surface of the refrigerant introducing pipe 17. A force with which the corners 3 press the refrigerant introducing pipe 17 is dispersed in a longitudinal direction outwardly beyond the corners 3, resulting in no scratch on the surface of the refrigerant introducing pipe 17 by being excessively pressed by the corners 3. As mentioned above, it is possible to secure reliability and physical strength of the refrigerant introducing pipe 17 by keeping the surface of the refrigerant introducing pipe 17 smooth.

As shown in FIG. 2(b), operation for moving the punch 7 forward is stopped when a deformation quantity p of the refrigerant introducing pipe 17 reaches a desired size to move the punch 7 backward to the position shown in FIG. 2(a). The refrigerant introducing pipe 17 is closely fitted with the inner surface of the groove 11 in the process so far. And as shown in FIG. 3(c), curbed surfaces of curvature radius R substantially identical to the corners 3 of the punch 7 are formed in the refrigerant introducing pipe 17. Further, no unnecessary bending force is applied to the refrigerant introducing pipe 17 projecting from the edges 15 because a reaction force for plastically deforming the aforementioned refrigerant introducing pipe 17 is completely received between the corners 3 of the punch 7 and the edges 15 of the heat-transfer member 9. Accordingly, it is possible to assemble a cooling member 19 which is accurate in dimension and direction of the refrigerant introducing pipe 17 projecting from the edges 15.

In the cooling member 19, a region 23 to be pressed is formed in the refrigerant introducing pipe 17 by the shrinkage of the refrigerant introducing pipe 17 in a direction where the refrigerant introducing pipe 17 is pressed to the punch 7 of a press machine. Moreover, in the refrigerant introducing pipe 17, curbed surface portions 25 in the shape of gradually shrinking in a direction where the refrigerant introducing pipe 17 are pressed to the press machine with a move to the region 23 to be pressed from the edges 15 of the heat-transfer member 9. Gradually shrinking means herein that the refrigerant introducing pipe 17 is mostly plastically deformed into the shape of a curbed surface of the curvature radius R in accordance with the corners 3 of the punch 7.

The curvature radius R is preferably greater than a thickness t of the refrigerant introducing pipe 17 from a viewpoint of avoiding the concentration of stress on a portion where the refrigerant introducing pipe 17 has been deformed. Further, when the curvature radius R is greater than a diameter $\phi$ of the refrigerant introducing pipe 17, the deformation quantity of the refrigerant introducing pipe 17 runs short between the corners 3 of the punch 7 and the edges 15 of the heat-transfer member 9. As a result, a contact force between the inner surface of the groove 11 and the refrigerant introducing pipe 17 becomes weaker, so that heat-transfer performance therebetween is lost. It is, therefore, preferable to set in such a manner that the curvature radius R of the corners 3 is $t<R<\phi$.

Since the corners 3 of the punch 7 get closer to the edges 15 of the heat-transfer member 9 so as to set the dimension d small, resulting in a stronger tendency to apply a bending force based on the reaction force of the aforementioned plastic deformation to the refrigerant introducing pipe 17, the dimension d is preferably set greater than the deformation quantity p of the refrigerant introducing pipe 17. Since the width x to be pressed of the pressing surface 5 is restricted when the dimension d is set to be twice as great as the diameter $\phi$ of the refrigerant introducing pipe 17, heat-transfer performance between the inner surface of the groove 11 and the refrigerant introducing pipe 17 is lost. Accordingly, the dimension d is preferably set in such a manner that $p<d<2\phi$.

As FIG. 3(d) shows, when the aforementioned conditions that $p<d<2\phi$ are satisfied, an arc-like clearance 21 remains between the inner surface of the groove 11 near the edge 15 and the refrigerant introducing pipe 17 in the stage that the cooling member 19 is assembled. Even when an external force is applied to the refrigerant introducing pipe 17 in a bending direction, it is possible to secure the physical strength of the refrigerant introducing pipe 17 and reduce time and costs for performing R processing on respective heat-transfer members like conventional ones because it is possible to prevent the concentration of the stress near the boundary between the refrigerant introducing pipe 17 and the edges 15.

In the case where work for coating the refrigerant introducing pipe 17 shown in FIG. 3(c) with a coating material, the coating material is introduced to the whole circumference of the refrigerant introducing pipe 17 along the clearance 21 by making the boundary between the refrigerant introducing pipe 17 and the edges 15 indicating as reference numeral 23 lightly in contact with the coating material (capillarity). Additionally, it is possible to easily perform this work from a surface side of the cooling member 19, so that it is possible to efficiently coat a desired portion in the cooling member 19 with the coating material.

And the heat-transfer member 9 may be directly positioned on a bed of the press machine so that the bed can play a role of a support 13. For instance, it is not essential that one punch 7 has two corners 3 and one punch or a plurality of punches having one corner may be attached to a ram of the press machine. The shape of the heat-transfer member 9 is not limited to a rectangular plate but may be disk-shaped.

Figure 4:
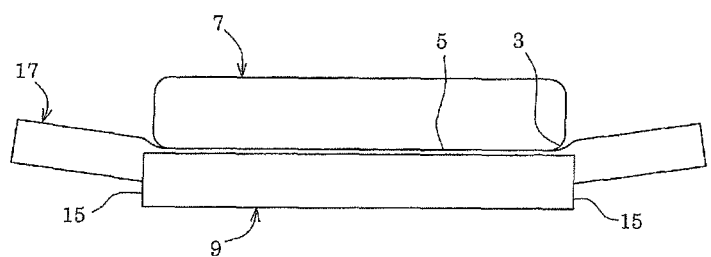
FIG. 4(a) is a side view showing a process of operation of the manufacturing device for the cooling member according to Example 1 of the present invention.
FIG. 4(b) is a side view showing a process of operation of a first variant of the manufacturing device for the cooling member.
Figure 4:
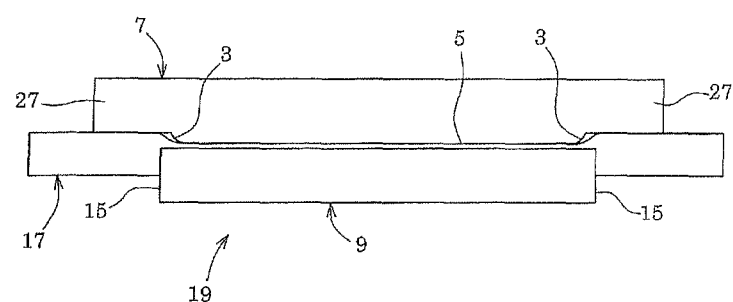

As shown in FIG. 4(a), there is a possibility that a reaction force of plastically deforming the refrigerant introducing pipe 17 with a press machine may cause an upward warping on the refrigerant introducing pipe 17. Therefore, as shown in FIG. 4(b), back-up portions 27 extending from both ends in a direction along the refrigerant introducing pipe 17 are provided on the punch 7 to hit the back-up portions 27 against the refrigerant introducing pipe 17 upwardly depending on the material of the refrigerant introducing pipe 17 and a speed of moving the punch 7 forward. This restricts the warping of the refrigerant introducing pipe 17 and makes it possible to assemble the cooling member 19 that is accurate in dimension and direction of the refrigerant introducing pipe 17 projecting from the edges 15.

Figure 5:
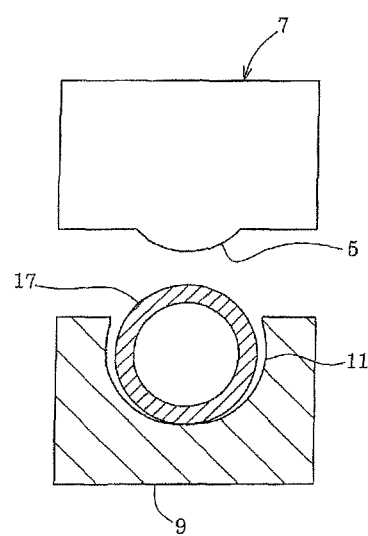
FIG. 5(a) is a cross-sectional view in a width direction showing a process of operation of a second variant of the manufacturing device for the cooling member according to Example 1 of the present invention.
FIG. 5(b) is a cross-sectional view of a cooling member manufactured by the device.
Figure 5:
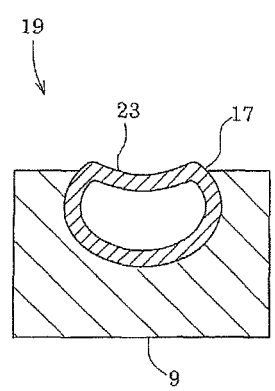

Furthermore, while explanation has been given as described above provided that the pressing surface 5 of the punch 7 is in the flat shape, as shown in FIG. 5(a), the pressing surface 5 may be in a convex shape projecting against the groove 11. In this case, the cross section of the region 23 to be pressed in the refrigerant introducing pipe 17 turns into a concave shape as shown in FIG. 5(b) when pressing the pressing surface 5 to the refrigerant introducing pipe 17 inserted into the groove 11. Alternatively, as shown in FIG. 6(a), the pressing surface 5 may be concave-shaped against the groove 11. In this case, the cross section of the region 23 to be pressed turns into a convex shape as shown in FIG. 6(b) when pressing the pressing surface 5 to the refrigerant introducing pipe 17.

EXAMPLE 2

Same names will be subsequently used for elements already mentioned in Example 1 regardless of embodiments shown in the following drawings or whether or not shown in figures.

Figure 7:
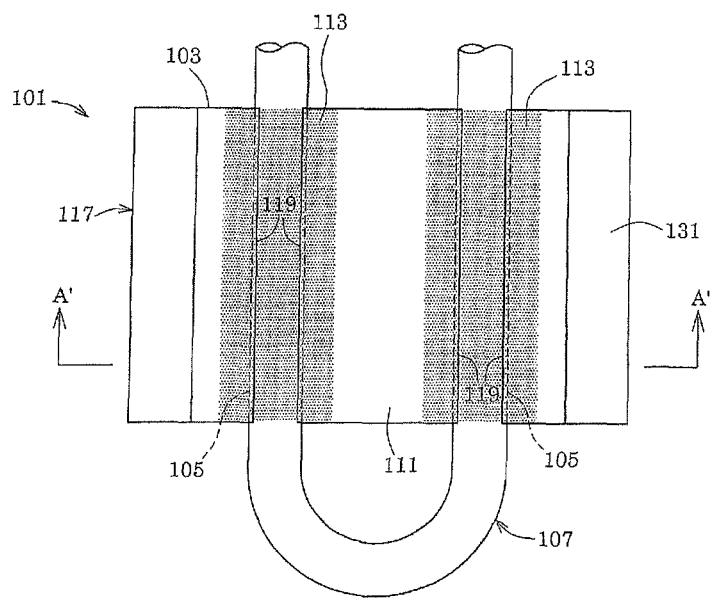
FIG. 7(a) is a plan view of a cooling member according to Example 2 of the present invention.
FIG. 7(b) is a cross-sectional view in a width direction in which the cooling member is fractured on A'-A' line.
Figure 7:
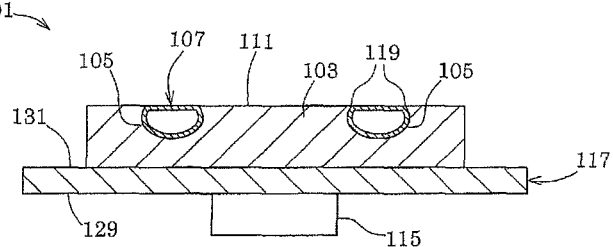

As shown in FIG. 7(a), in a cooling member 101, a refrigerant introducing pipe 107 is pressed into grooves 105 of a heat-transfer member 103 and a surface 111 of the heat-transfer member 103 and the refrigerant introducing pipe 107 are covered with covering materials 113. As shown in FIG. 7(b), a heat-conducting member 117 composed of an aluminum plate is attached to electric parts 115 to connect the heat-transfer member 103 to the electric parts 115 through the heat-conducting member 117. However, the heat-conducting member 117 may be omitted and the heat-transfer member 103 may be directly connected to the electric parts 115.

The heat-transfer member 103 is an aluminum plate and openings of the grooves 105 are opened on the surface 111 of the heat-transfer member 103. The covering materials 113 are coating materials applied to dotted regions of the refrigerant introducing pipe 107 in the figure. Such regions are not limited at all, but it is enough that at least the coating materials may be applied to joints 119 between the heat-transfer member 103 and the refrigerant introducing pipe 107.

Figure 8:
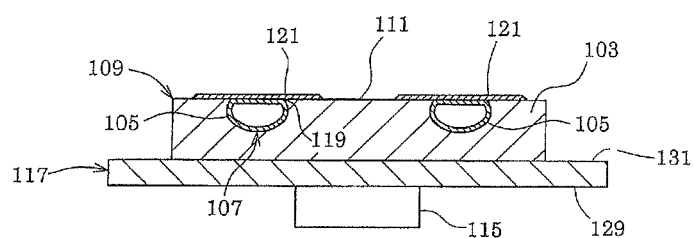
FIG. 8 is a cross-sectional view showing a first variant of the cooling member according to Example 2 of the present invention.

Additionally, films or adhesive tapes to be adhered to the aforementioned regions may be applied as the covering materials 113. Alternatively, plate materials 121 shown in FIG. 8 may be applied.

In the cooling member 101, the joints 119 between the heat-transfer member 103 and the refrigerant introducing pipe 107 are blocked from the peripheral atmosphere by the covering materials 113. Thus, it is possible to prevent moisture from entering the joints 119 even when the heat-transfer member 103 and the refrigerant introducing pipe 107 build up condensation. And even when the heat-transfer member 103 and the refrigerant introducing pipe 107 contact poisonous gas or are under the environment in which salt is splashed, it is possible to prevent poisonous gas or salt from entering the joints 119 using the covering materials 113. This makes it possible to prevent the heat-transfer member 103 and the refrigerant introducing pipe 107 from corrosion.

In addition, the cooling member 101 is capable of securing preferable heat transfer between the heat-transfer member 103 and the refrigerant introducing pipe 107 as below and allowing performance of the electric parts 115 to properly exert.

Figure 9:
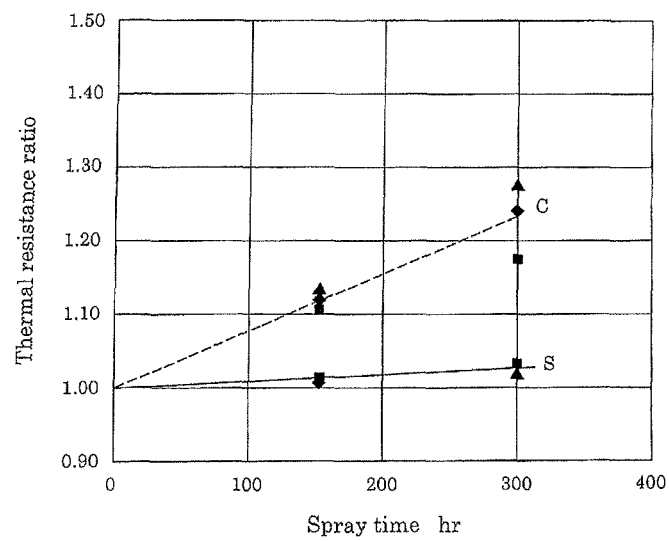
FIG. 9 is a graph showing changes of thermal resistance ratio caused by an acetic acid salt water spray test to be targeted for the cooling member shown in FIG. 8.

That is, the cooling member 101 shown in FIG. 7(a) is used as a sample of an example and a comparative sample in which covering materials are removed from the similar cooling member is prepared. Acetic acid salt water is then sprayed toward respective joints 119 of respective samples in the example and the comparative sample to measure thermal resistance ratio of the heat-transfer member 103 and the refrigerant introducing pipe 107 every time a certain time passes. This result is indicated in a graph in FIG. 9 in which spray time for spraying acetic acid salt water is indicated as a horizontal axis and thermal resistance ratio is indicated as a vertical axis. While a solid line S in FIG. 9 indicates that the thermal resistance ratio has little increased in the sample of the example, a dotted line C indicates that the thermal resistance ratio of the comparative sample has increased as a spray time passes.

It is possible to achieve effects of the cooling member 101 as described above whether or not the covering materials are films, adhesive tapes, coating materials or the plate material 121. Particularly, in the case where coating materials are selected as the covering materials 113, it is possible to easily achieve the aforementioned effects by simply applying the coating materials to the surface 111 of the heat-transfer member 103 and the refrigerant introducing pipe 107 quickly.

Figure 10:
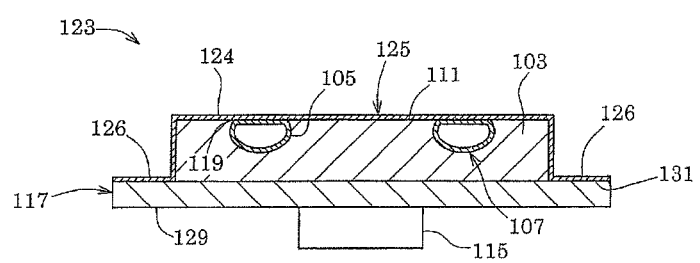
FIG. 10 is a cross-sectional view showing a second variant of the cooling member according to Example 2 of the present invention.

As shown in FIG. 10, a cooling member 123 is similar to the aforementioned cooling member 101 except that a cover 125 for covering the heat-transfer member 103 and the refrigerant introducing pipe 107 is applied as a covering material. In the cover 125, the heat-transfer member 103 is buried inside a channel portion 124 to arrange a pair of flanges 126 extending from both sides of the channel portion 124 at a position opposite to the heat-conducting member 117. The flanges 126 of the cover 125 may be fixed to the heat-conducting member 117 with an adhesive or may be fastened with screws or the like. Further, it is preferable that the heat-conducting member 117 and the pair of flanges 126 are airtightly joined to each other and a sealing material may intervene therebetween and the like.

Since it is easy to remove the cover 125 from the heat-transfer member 103 as a merit of the cooling member 123, it is possible to efficiently separate the cover 125 and the heat-transfer member 103 to perform recycling. Furthermore, the material of the cover 125 may be a metal or a synthetic resin and thus a substance having a physical strength higher than the coating material may be applied. The cover 125 has, therefore, a merit of being insusceptible to damage, even when receiving an external force or an impact, and not carelessly dropping out of the heat-transfer member 103.

Figure 11:
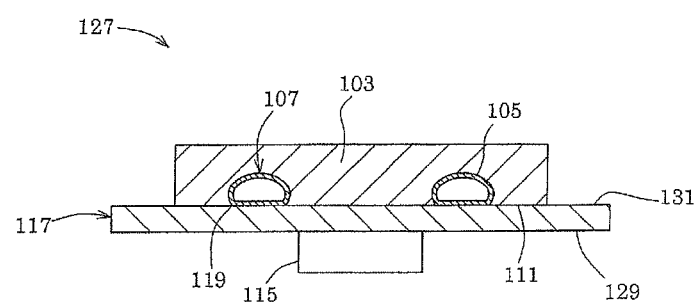
FIG. 11 is a cross-sectional view showing a third variant of the cooling member according to Example 2 of the present invention.

As shown in FIG. 11, the heat-conducting member 117 is utilized as a covering material in a cooling member 127, so that the number of parts is few and the manufacturing costs are less expensive because neither the aforementioned coating materials nor the cover is needed. In this case, electric parts 115 are mounted on one surface 129 of the heat-conducting member 117 and the surface 111 of the heat-transfer member 103 and the refrigerant introducing pipe 107 are closely fitted with other surface 131 of the heat-conducting member 117.

Figure 12:
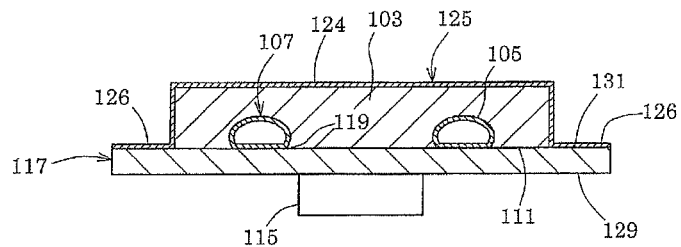
FIG. 12 is a cross-sectional view showing a fourth variant of the cooling member according to Example 2 of the present invention.
Figure 13:
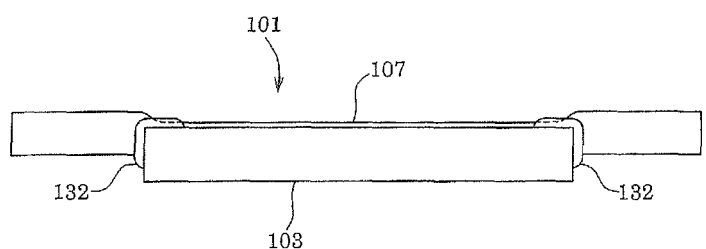
FIG. 13 is a side view showing a fifth variant of the cooling member according to Example 2 of the present invention.

As shown in FIG. 12, the heat-transfer member 103 and the refrigerant introducing pipe 107 may be housed in the cover 125 in the state that the surface 111 of the heat-transfer member 103 and the refrigerant introducing pipe 107 are closely fitted with the other surface 131 of the heat-conducting member 117. As mentioned above, the clearance 21 shown in FIG. 3(d) remains in the cooling member. Sealing materials 132 shown in FIG. 13 may be inserted into such a clearance to prevent water and dirt or the like from entering between the heat-transfer member 103 and the refrigerant introducing pipe 107.

EXAMPLE 3

Figure 14:
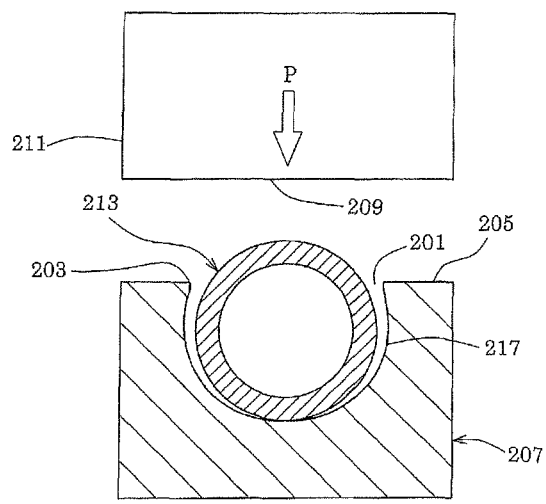
FIG. 14(a) is a cross-sectional view in a width direction showing a process of a manufacturing method for a cooling member according to embodiments of the present invention.
FIG. 14(b) is a cross-sectional view of a cooling member manufactured by the method.
Figure 14:
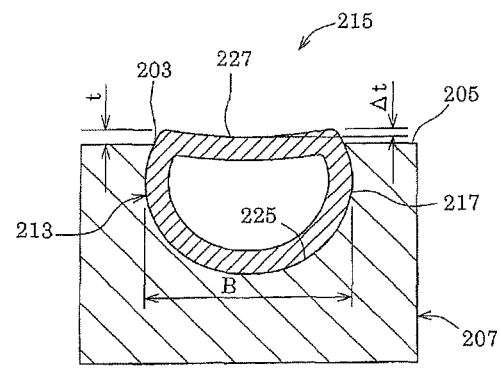

Embodiments of a cooling member and a method for manufacturing the same according to the present invention will now be described. FIG. 14(a) shows a heat-transfer member 207 in which an opening 203 of a groove 201 is opened to a surface 205, a punch 211 having a flat pressing surface 209 arranged at a position opposite to the groove 201, and a refrigerant introducing pipe 213 inserted into the groove 201. Curved surface-shaped corners are longitudinally formed at ends of the punch 211 in the same manner as Example 1.

Figure 15:
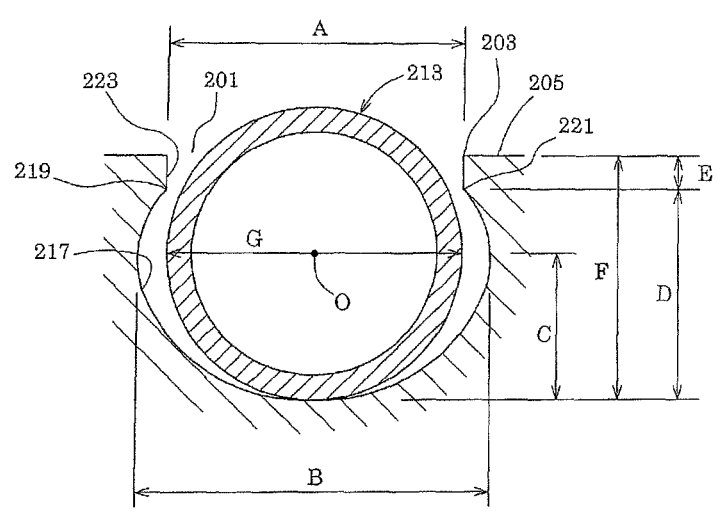
FIG. 15 is a view in which a refrigerant introducing pipe is in accordance with dimensions of a groove of a heat-transfer member applied to a method for manufacturing a cooling member according to embodiments of the present invention.

As shown in FIG. 15, a center of curvature O of an inner circumferential surface 217 of the groove 201 is positioned inward the opening 203. Two corner portions 219 and 221 are the locations where the inner circumferential surface 217 warping in the shape of an ellipse is adjacent to an inner side 223 of the opening 203. The circumference of the inner circumferential surface 217 means herein the length of the inner circumferential surface 217 from the corner portion 219 to the corner portion 221. However, in Example 3, a thickness E from the corner portion 219 to the surface 205 and a thickness E from the corner portion 221 to the surface 205 are added. Accordingly, when the circumference of the inner circumferential surface 217 is L, A+L+2E<πG and the groove 201 satisfies with the conditions that the length (A+L) that the circumference of the inner circumferential surface 217 is added to the width A of the opening 203 is shorter than an outer circumference (πG) of the refrigerant introducing pipe 213.

TABLE 1

| Symbol | Dimensions [mm] | Designation |
| --- | --- | --- |
| A | 9.7 ± 0.1 | Width of opening |
| B | 10.7 ± 0.1 | Major axis |
| C | 3.95 | Half of minor axis |
| D | 5.61 | Height of intersection point |
| E | 0.44 | Thickness |
| F | 5.95 ± 0.1 | Depth |
| G | 5.92 ± 0.08 | Diameter |

Table 1 shows dimensions of A to G. All of the unit of dimensions mentioned below is [mm]. Referring now to the procedures to calculate the dimensions of A to G using a case where the diameter of the refrigerant introducing pipe 213 includes a margin of errors ±0.08 when the diameter is 9.52 as an example. First, it is set that A=9.7±0.1 in such a manner that a width A of the opening 203 may be not smaller than the maximum value of 9.60 of the diameter of the refrigerant introducing pipe 213. The maximum value Amax of the width A in the opening 203=9.8. The minimum value Bmin=10.6 is calculated based on the following equation so that an over hang quantity, in which the difference between the maximum value Amax and the minimum value Bmin of a full width B of the inner circumferential surface 217 that is a major axis of an ellipse is divided by 2, may be at least 0.4 (about 4% of A). When the margin of errors at the time of the formation of the groove 201 in the heat-transfer member 207 is estimated to be ±0.1, the value of B may be determined at 10.7±0.1.

$$\frac{Bmin - Amax}{2} = 0.4 \text{ [mm]} \quad \text{Equation 1}$$

Figure 16:
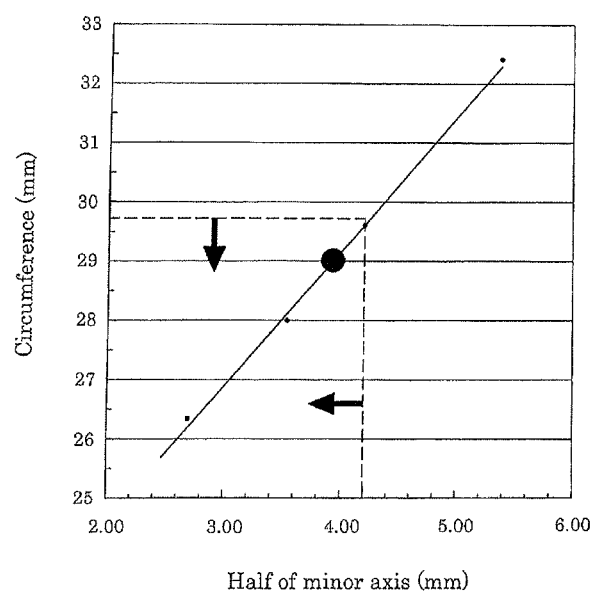
FIG. 16 is a graph in which a half of a minor axis of a groove in a heat-transfer member applied to the method for manufacturing a cooling member according to embodiments of the present invention is indicated as a horizontal axis and a calculated value of the circumference of an inner circumferential surface is indicated as a vertical axis.

Subsequently, assuming that a thickness E=0.44, a calculated value of the circumference of the inner circumferential surface 217 at the time when the minor axis of an ellipse in contact with both corner portions 219 and 221 is obtained. FIG. 16 is a graph in which a half of a minor axis corresponding to a half of a minor axis of an ellipse is indicated as a horizontal axis and a calculated value of the circumference of the inner circumferential surface 217 is indicated as a vertical axis. Since the minimum value of the outer circumstance (πG) of the refrigerant introducing pipe 213 is approximately 29.7, conditions in which the circumference of the inner circumferential surface 217 is shorter than the minimum value are that the half of the minor axis of the ellipse is not more than the value divided by a broken line in FIG. 16. For example, when πG<29, c<4.

The method for manufacturing a cooling member 215 is as below. Referring now to FIG. 14(a) and FIG. 14(b) unless otherwise limited. First, the refrigerant introducing pipe 213 inserted into the groove 201 of the heat-transfer member 207 is pressed into the groove 201 with the punch 211 so that the refrigerant introducing pipe 213 to be plastically deformed may be closely fitted with the inner circumferential surface 217 of the groove 201. At this point, the refrigerant introducing pipe 213 partially projects from the opening 203 of the groove 201. This is because a portion of the refrigerant introducing pipe 213 projects from the surface 205 of the heat-transfer member 207 by the length to which the circumference of the inner circumferential surface 217 is added to is shorter than the outer circumference of the refrigerant introducing pipe 213. Additionally, the center of curvature O of the groove 201 is located inwardly of the opening 203 in the heat-transfer member 207. Accordingly, as mentioned above, at the point when the refrigerant introducing pipe 213 is closely fitted with the inner circumferential surface 217 of the groove 201, the width of the refrigerant introducing pipe 213 becomes greater than the opening 203, which leads to restrict the separation of the refrigerant introducing pipe 213 from the heat-transfer member 207. This completes the join between the heat-transfer member 207 and the refrigerant introducing pipe 213.

Therefore, according to the method described above, there is no possibility of a clearance remaining between the heat-transfer member 207 and the refrigerant introducing pipe 213 at the point when the heat-transfer member 207 is joined to the refrigerant introducing pipe 213 in a state that the refrigerant introducing pipe 213 projects from the surface 205 of the heat-transfer member 207, even when an dimensional error is respectively included in the outer circumference of the refrigerant introducing pipe 213 and the circumference of the inner circumferential surface 217 in the groove 201. This enables the cooling member 215 to materialize preferable heat transfer from the heat-transfer member 207 to a curved portion 225 of the refrigerant introducing pipe 213. The curbed portion 225 is a portion where the refrigerant introducing pipe 213 has been plastically deformed into an ellipse that is in the same shape as the inner circumferential surface 217 of the groove 201 by being fitted with the inner circumferential surface 217. Further, the cross section of the inner circumferential surface 217 is an ellipse in which the direction of the major axis is conformed to the width direction of the opening 203, so that it is possible to firmly hold the refrigerant introducing pipe 213 on the heat-transfer ember 207 relative to an external force in a deviation direction to be applied to the refrigerant introducing pipe 213.

Furthermore, according to the method described above, it is possible to prevent the refrigerant introducing pipe 213 from bending by force by setting a force to press the refrigerant introducing pipe 213 with the punch 211 so that the refrigerant introducing pipe 213 may project from the surface 205 until the refrigerant introducing pipe 213 partially projects from the groove 201, which leads to form a plane portion 227 on the refrigerant introducing pipe 213. The plane portion 227 is a portion where the refrigerant introducing pipe 213 has been plastically deformed into a flat shape which is in the same shape as the pressing surface 209 of the punch 211.

Figure 17:
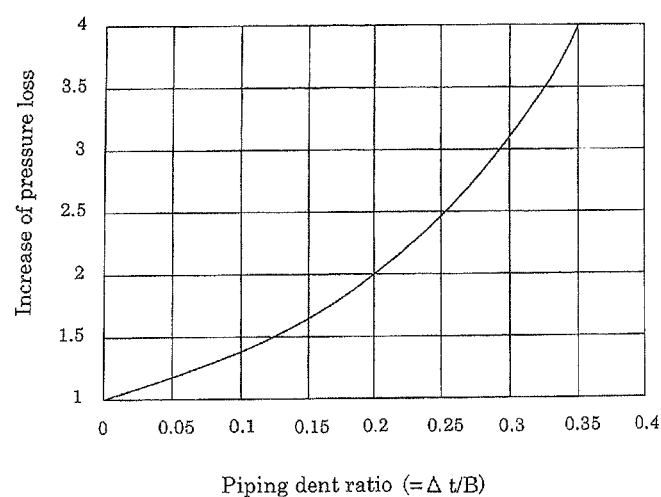
FIG. 17 is a graph showing a dent ratio of a refrigerant introducing pipe deformed by the method for manufacturing a cooling member according to embodiments of the present invention in a horizontal axis and an increase ratio of pressure loss of refrigerant according to an increase in the dent ratio in a vertical axis.

FIG. 17 is a graph in which a horizontal axis represents a dent ratio obtained by dividing a dent amount Δt of the plane portion 227 by the major axis B (full width of the inner circumferential surface 217) and a vertical axis represents a ratio of increasing pressure loss in a refrigerant flowing in the refrigerant introducing pipe 213 as the dent ratio increases as an increase ratio of pressure loss. It will be understood from FIG. 17, it is necessary to limit the dent ratio to 0.3 or smaller to make the increase ratio of pressure loss to 3 or smaller. To materialize this, a force of the punch 211 to press the refrigerant introducing pipe 213 is so adjusted that a height t of the plane portion 227 projecting from the surface 205 of the heat-transfer member 207 may be smaller than the thickness of the refrigerant introducing pipe 213.

The dimensional difference between the major axis of the ellipse and the width of the opening 203 is greater than the case in which the cross section of the inner circumferential surface 217 is in the shape of a conventional arc because the direction of the major axis of the aforementioned ellipse coincides with the width direction of the opening 203 in the cooling member 215. Accordingly, that is advantageous to increase an over hang quantity in the stage of forming the groove 201 in the cooling member 215, resulting in reinforcement of the joining between the heat-transfer member 207 and the refrigerant introducing pipe 213. Additionally, it is possible to improve the physical strength of the opening 203 in the heat-transfer member 207 by setting the thickness E at 0.44 in the aforementioned example.

In order to recycle the cooling member 215, it is necessary to separate the refrigerant introducing pipe 213 in which the curbed portion 225 and the plane portion 227 are formed to sort out the refrigerant introducing pipe 213 and the heat-transfer member 207. In this case, it is possible to return the cross section of the refrigerant introducing pipe 213 to a circle to easily remove the refrigerant introducing pipe 213 from the opening 203 of the groove 201 by supplying inside the refrigerant introducing pipe 213 with compressed air so as to expand the refrigerant introducing pipe 213.

Figure 18:
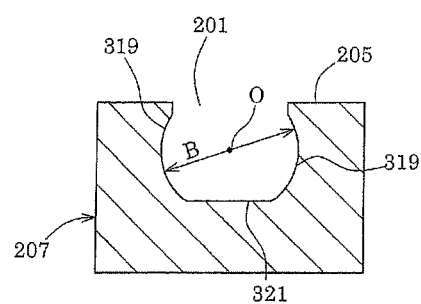
FIG. 18(a) is a cross-sectional view showing a fifth variant of a heat-transfer member applicable to the method for manufacturing a cooling member according to embodiments of the present invention.
FIG. 18(b) is a cross-sectional view showing a sixth variant of a heat-transfer member applicable to the method for manufacturing a cooling member according to embodiments of the present invention.
Figure 18:
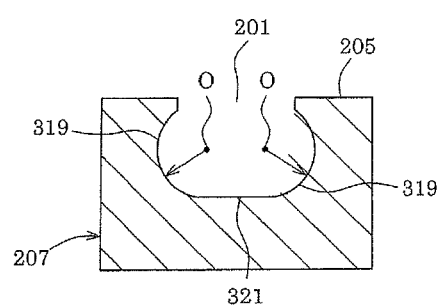
Figure 19:
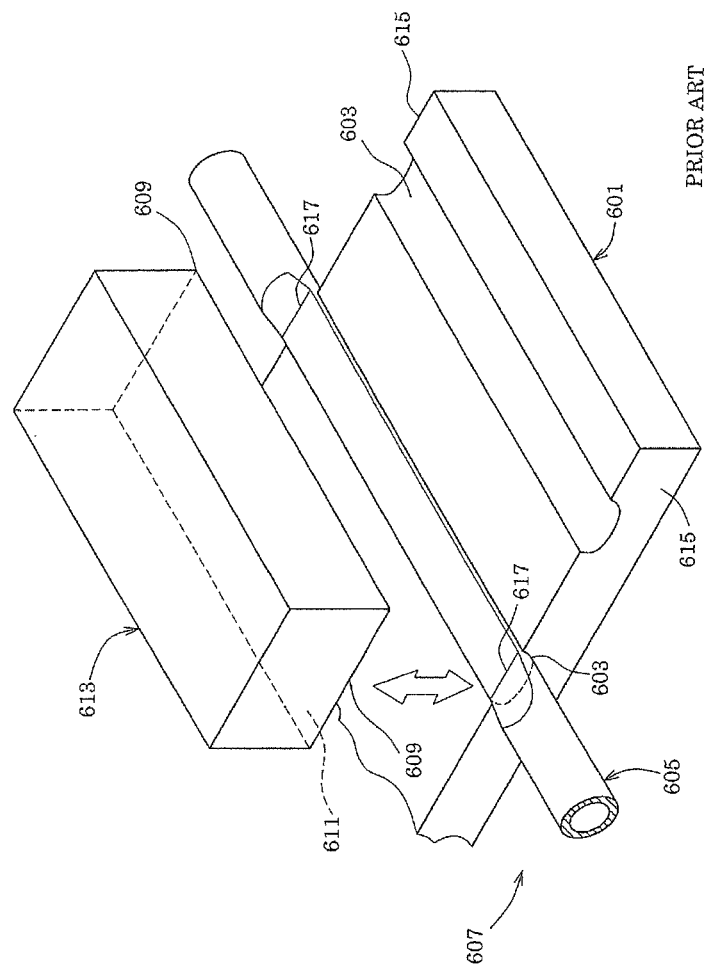
FIG. 19 is a perspective view illustrating procedures for a conventional method for manufacturing a cooling member.
Figure 20:
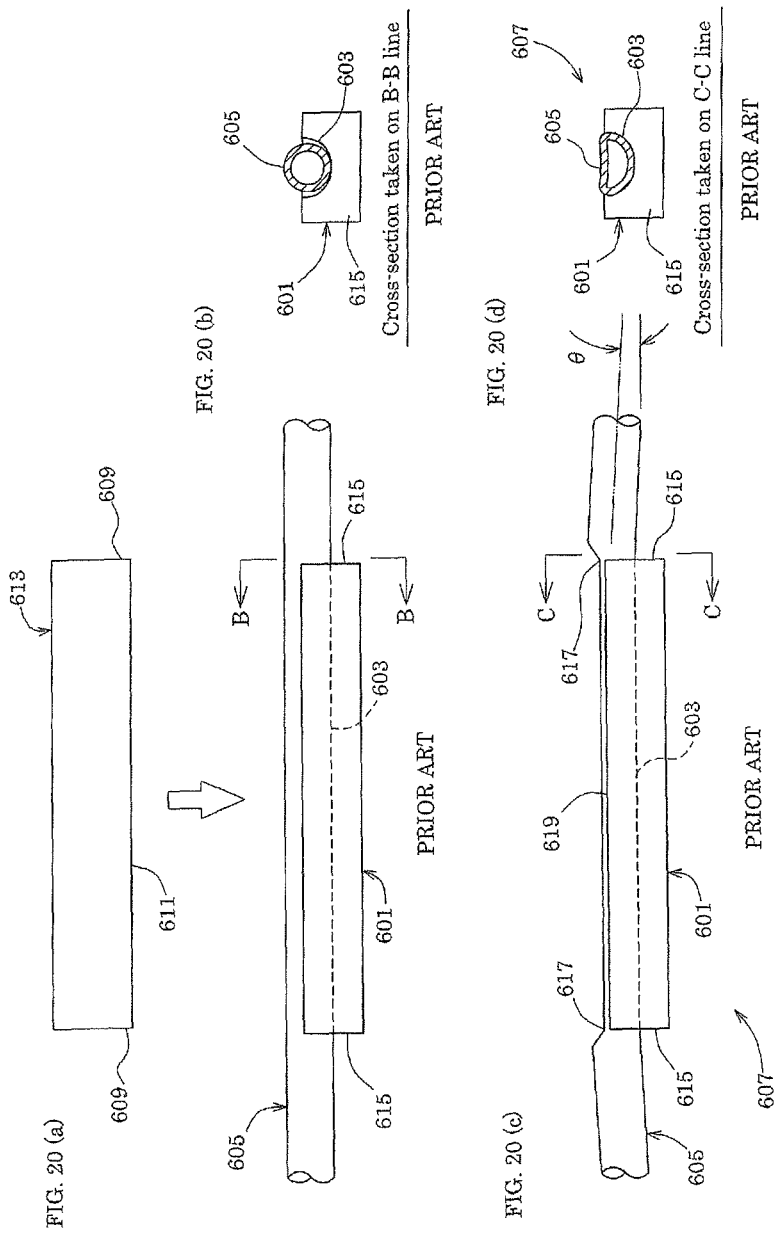
FIGS. 20(a) and 20(c) are respectively side views illustrating procedures for a conventional manufacturing method for a cooling member.
FIG. 20(b) is a cross-sectional view taken on B-B lines.
FIG. 20(d) is a cross-sectional view taken on C-C lines.
Figure 21:
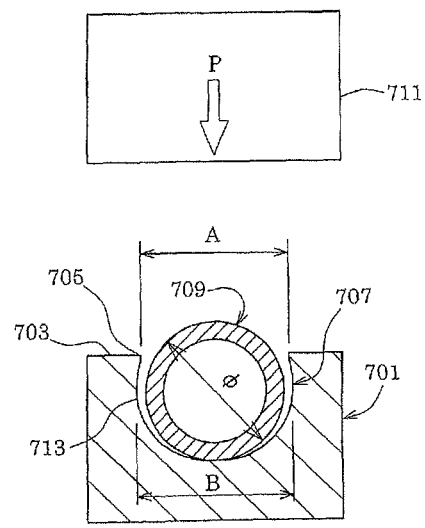
FIG. 21(a) is a cross-sectional view showing an example of a conventional process for manufacturing a cooling member.
FIG. 21(b) is a cross-sectional view showing an example of a cooling member manufactured by the process.
Figure 21:
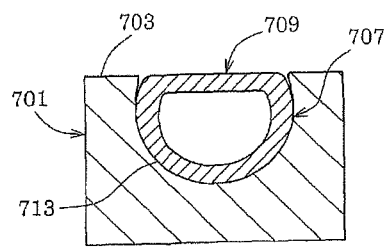
Figure 22:
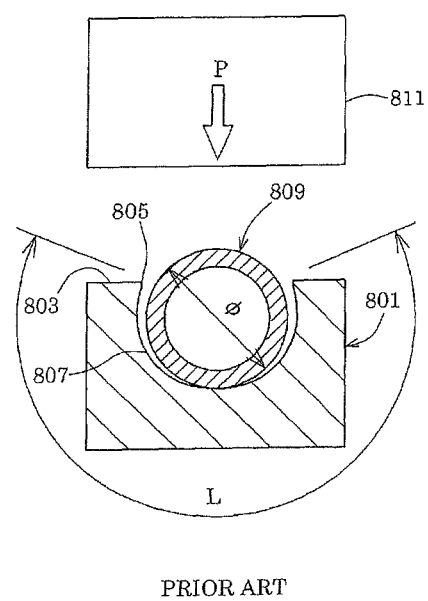
FIG. 22(a) is a cross-sectional view showing a conventional process for manufacturing a cooling member.
FIGS. 22(b) to 22(d) are respectively cross-sectional views of an example of a cooling member manufactured by the process.
Figure 22:
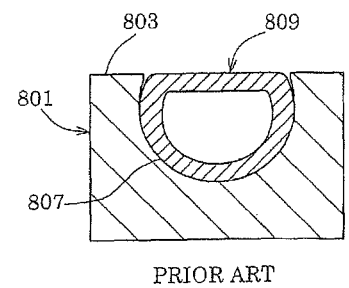
Figure 22:
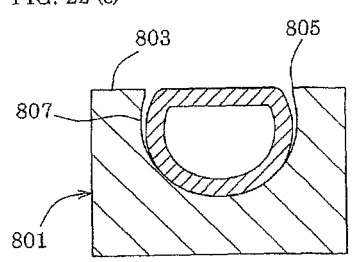
Figure 22:
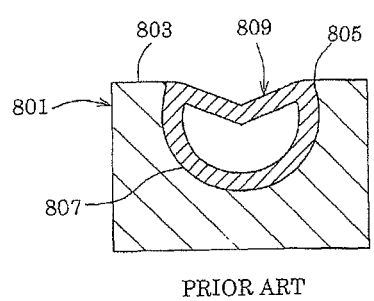

It is to be understood that the present invention may also be carried out in aspects to which various improvements, modifications or variations are added based on knowledge of a skilled person in the art without departing from the spirit and scope of the invention. Typically, the cross section of the inner circumferential surface 217 is not limited to an ellipse, but may be in the shape of a parabola having conformed to the direction of a geometric central axis to the width direction of the opening 203. As shown in FIG. 18(a), the cross section of the inner circumferential surface 217 may be in an oval shape in which the major axis coincides with the width direction of the opening 203. Alternatively, the inner circumferential surface 217 of the groove 201 may be in the shape that an arc portion 319 and a linear bottom surface 321 are combined together. As shown in FIG. 18(b), the inner circumferential surface 217 has two or more centers of curvature O.

Even when an external force in a deviation direction is applied to the refrigerant introducing pipe 213 being closely fitted with the inner circumferential surface 217 of the groove 201, the aforementioned cooling member having the heat-transfer member 207 is capable of preventing the refrigerant introducing pipe 213 from rotating relative to the heat-transfer member 207 without heavily depending on a frictional force between the heat-transfer member 207 and the inner circumferential surface 217.

The present invention is a useful technology to manufacture a cooling member for cooling electric parts to produce heat, such as power modules or the like.

The invention claimed is:

1. A cooling member comprising:
   a heat-transfer member having a surface with a groove opened to the surface of the heat-transfer member, the heat transfer member being a plate;
   a refrigerant introducing pipe pressed into the groove, the groove having tabs extending toward each and formed to retain the pipe in the groove such that the heat transfer member partially overlies the refrigerant introducing pipe as viewed along a direction perpendicular to the surface of the heat transfer member, outer surfaces of the tabs being located on a same surface as a plane of the surface of the heat transfer member, and the refrigerant introducing pipe being in contact with the groove and inner surfaces of the tabs; and
   a covering material coating portions of the surface of the heat-transfer member adjacent the groove and an exposed portion of the refrigerant introducing pipe disposed in the groove such that the covering material is applied to joints between the heat-transfer member and the refrigerant introducing pipe to block the joints from atmosphere, and portions of the surface of the heat transfer member spaced from the groove being uncovered by the covering material.

2. The cooling member according to claim 1, wherein the covering material includes a coating material applied to the surface of the heat-transfer member and the refrigerant introducing pipe.

3. The cooling member according to claim 1, wherein the covering material includes a cover that covers the heat-transfer member.

4. The cooling member according to claim 1, wherein electric parts are mounted on one surface of a heat-conducting member, which is arranged and configured to make the surface of the heat-transfer member and the refrigerant introducing pipe closely fitted with each other on another surface of the heat-conducting member.

* * * * *